United States Patent [19]

Cogan et al.

[11] Patent Number: 4,967,245

[45] Date of Patent: Oct. 30, 1990

[54] TRENCH POWER MOSFET DEVICE

[75] Inventors: Adrian I. Cogan, San Jose; Neill R. Thornton, Alameda, both of Calif.

[73] Assignee: Siliconix incorporated, Santa Clara, Calif.

[21] Appl. No.: 167,617

[22] Filed: Mar. 14, 1988

[51] Int. Cl.[5] .................... H01L 29/78; H01L 29/06
[52] U.S. Cl. .................... 357/23.4; 357/55; 437/203
[58] Field of Search .................... 357/23.4, 55, 59 G, 357/49; 437/73, 79, 203

[56] References Cited

U.S. PATENT DOCUMENTS

| | | | |
|---|---|---|---|
| Re. 32,090 | 3/1986 | Jaccodine et al. | 357/51 |
| 4,462,040 | 7/1984 | Ho et al. | 357/23 |
| 4,571,513 | 2/1986 | Lade et al. | 307/577 |
| 4,574,207 | 3/1986 | Benjamin et al. | 307/577 |
| 4,672,410 | 6/1987 | Miura et al. | 357/23.6 |
| 4,749,661 | 6/1988 | Bowen | 437/33 |
| 4,767,722 | 8/1988 | Blanchard | 437/41 |

FOREIGN PATENT DOCUMENTS 0177675  9/1985  Japan .................... 357/23.4

*Primary Examiner*—Andrew J. James
*Assistant Examiner*—Stephen D. Meier
*Attorney, Agent, or Firm*—Skjerven, Morrill, MacPherson, Franklin & Friel

[57] ABSTRACT

A trench power MOSFET device is disclosed wherein the method of manufacturing produces a high density MOSFET cell with good breakdown characteristics.

4 Claims, 4 Drawing Sheets

TRENCH POWER MOSFET DEVICE

FIELD OF THE INVENTION

This invention relates to a method for producing power MOSFET transistors with high cell density.

BACKGROUND OF THE INVENTION

A power MOSFET normally requires considerable "silicon real estate" to perform power control and/or switching with a transistor. At the same time, low "on-resistance" is required for efficient device operation. Low specific "on-resistance" is also desirable because device cost is proportional to device area on the chip and lower on-resistance is usually achieved only by increasing the size of the device. Such transistors often require extensive isolation between adjacent devices and a large gate width to prevent source-drain shorting through various breakdown processes. The subject invention allows fabrication of a power MOSFET with reduced gate width, in part through use of a relatively deep gate oxide positioned adjacent to the source and drain regions. This achieves low specific "on-resistance", can be fabricated in general shape die areas, and has low associated production costs.

SUMMARY OF THE INVENTION

One object of the invention is to provide a method for producing power MOSFET transistors.

Another object is to provide a method for producing power transistors of high cell density.

Another object is to provide power transistors using a buried polysilicon component.

Other objects of the invention, and advantages thereof, will become clear by reference to the detailed description and the accompanying drawings.

The foregoing objects may be achieved by a method comprising the steps of:

providing an n+ substrate with a relatively thick layer of n− material contiguous thereto and thinner layers of p, n+, oxide and silicon nitride material stacked on top of the n− material in that order; providing a substantially rectangular or trapezoidal groove in the structure that reaches through the nitride layer, oxide layer, thin n+ layer, p layer and through a portion of the thick n− layer to expose a bottom wall and side walls of the groove; providing a thick oxide layer on the groove bottom wall and a thin oxide layer on the groove side walls; providing polysilicon that fills the groove and forms a polysilicon layer covering the top of the groove; planarizing the top surface of the structure to provide a substantially planar top surface; providing a covering layer of substantially undoped oxide that selectively covers the polysilicon at the top of the groove and immediately adjacent to the groove; removing substantially all of the polysilicon, thin nitride layer, thin oxide layer and thin n+ layer at the top surface of the structure not covered by the undoped oxide covering layer, to expose the p layer; and providing a metallized layer of material covering and contiguous to the p layer, the top of the groove and all regions of material adjacent to the boundary of the groove.

DESCRIPTION OF THE PREFERRED EMBODIMENT

Figure 1:
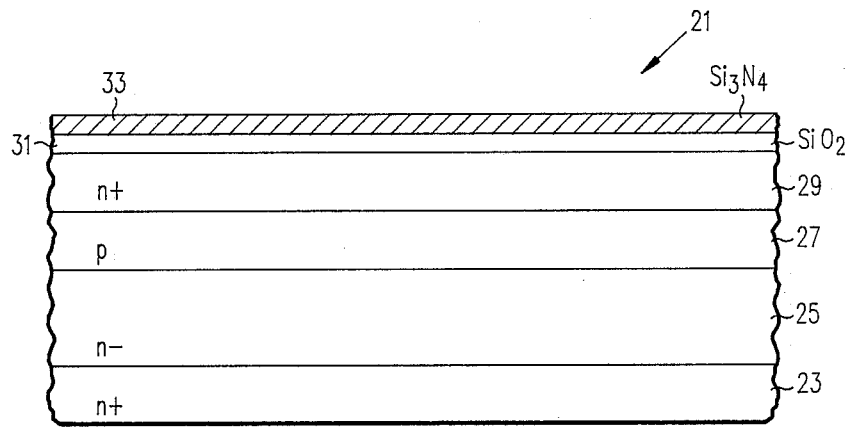
FIG. 1 is a sectional view of the initial semiconductor substrate/active layers combination to which the method may be applied.

The invention provides a high cell density structure that is suitable for power MOSFETs. With reference to the sectional view shown in FIG. 1, one begins with a layered combination structure 21 of semiconductor materials, the structure including: an n+ substrate layer 23 of Si or other suitable semiconductor material; an n− layer 25 of thickness substantially 2-5 μm contiguous to the top surface of substrate 23; a p layer 27 of thickness substantially 250-750 nm contiguous to the top surface of layer 25; an n+ layer 29 of thickness substantially 150-500 nm contiguous to the top surface of layer 27; a layer 31 of oxide material such as $SiO_2$ of thickness substantially 25-75 nm contiguous to the top surface of layer 29; and an initial covering layer 33 of protective nitride material such as $Si_3N_4$ of thickness substantially 100-200 nm contiguous to the top surface of layer 31. The nitride material that comprises layer 33 has substantially different thermal expansion and lattice parameters than does the crystalline silicon in layer 29, and the thin layer 31 of $SiO_2$ material can take up most of the resulting stress of the layer 31/layer 33 interface that would otherwise appear in the silicon material that comprises layer 29. Provision of the $SiO_2$ layer 31 is optional but is preferred here.

Figure 2:
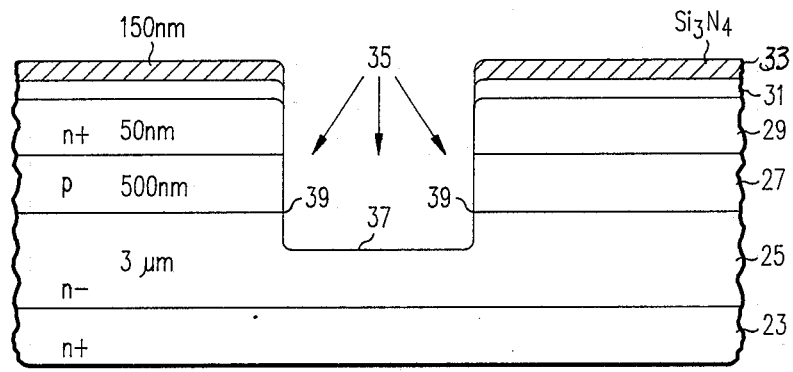
FIG. 2 is a sectional view of the material combination of FIG. 1 with a rectangular or trapezoidal groove etched therein.

A portion of predetermined shape of the top surface of protective layer 33 is masked and etched, preferably using an anisotropic dry etching process ("etchant") that will produce a substantially rectangular or trapezoidal groove 35 in the transverse cross section shown in FIG. 2, where this groove reaches through all the thickness of each of layers 33, 31, 29 and 27 and reaches through a portion, but not all, of the thickness of n− layer 25. The bottom of the groove 35 may be adjacent to the top surface of the n+ layer 23 in FIG. 2; but this will reduce the breakdown voltage of the gate oxide and require use of smaller gate voltages. The n− layer 25 is 6-60 times as thick as each of the layers 27, 29, 31 and 33 so that terminating the action of this etchant in the interior of the n− layer 25 should not be a problem.

Figure 3A:
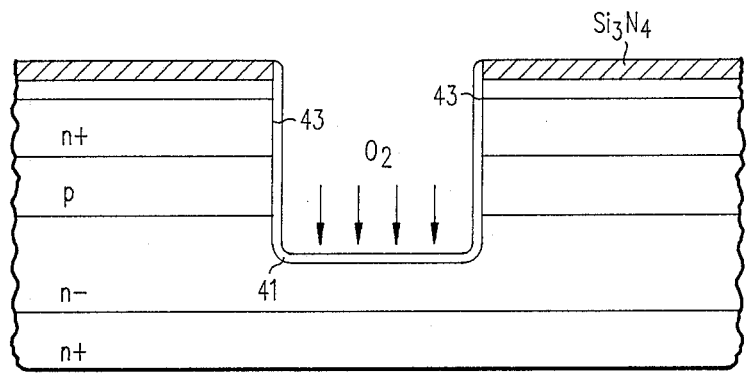
FIGS. 3a, 3b and 3c are sectional views of the structure of FIG. 2, with an oxide applied to the exposed walls of the groove by (a) oxide ion implantation, (b) heavy ion implantation and enhanced etching and (c) anisotropic etching, respectively.
Figure 3B:
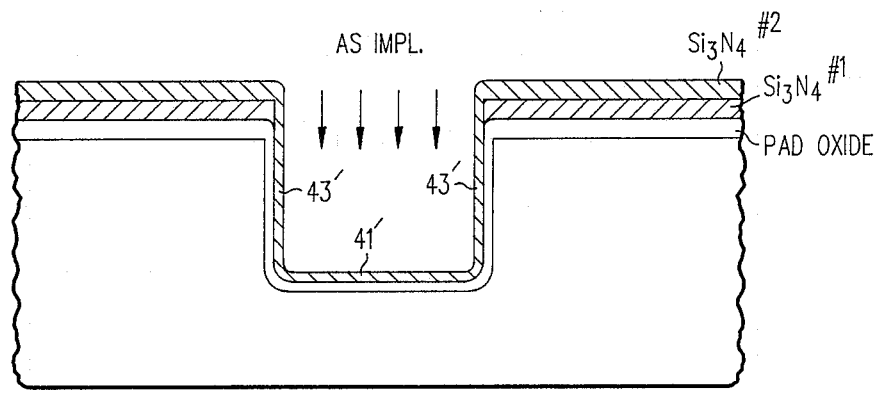
Figure 3C:
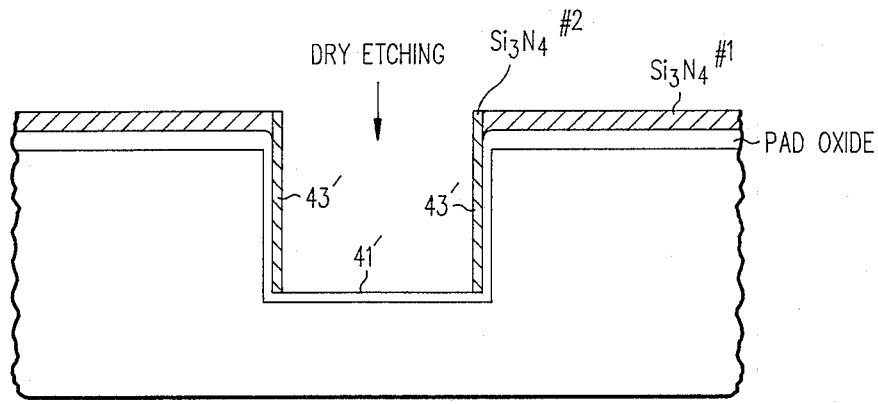

The groove 35 is then processed to form a thick oxide layer 41 on the exposed surface of the bottom wall 37 of groove 35 and a relatively thin oxide layer 43 on the exposed surfaces of the side walls 39 of the groove 35, as indicated in FIGS. 3a, 3b and 3c. The thin oxide layer 43 will serve as gate oxide. These oxide layers may be produced by any one of at least three techniques. In a first approach, one may use ion implantation of oxygen at the bottom wall 37, followed by growth of a thin oxide layer (50-200 nm) on the bottom wall as 41 and on the side walls as 43, as indicated in FIG. 3a.

In a second approach: (1) an oxide layer is grown thermally on the bottom wall 37 and side walls 39; (2) a second layer (not shown), of thickness substantially 100 nm, of nitride such as silicon nitride $Si_3N_4$ is substantially uniformly deposited in the groove and across the top surface of the structure; (3) an ion implant, using As, P, Sb, Bi or a similar ion, is performed on the bottom wall 37 of the groove 35 and on the remaining top surface 45 of the structure; (4) the second layer of nitride is removed by etching, taking advantage of the enhancement of the etching rate at the bottom wall 37 and top surface 45 by the heavy ion implant; (5) a thick oxide layer 41' (0.5-1) is grown thermally at the bottom wall 37 of the groove 35; (6) nitride (and some oxide) that adheres to the side walls 39 of the groove 35 is removed; and (7) a thin oxide layer, of thickness substantially 100 nm, is grown on the groove side walls (43') and on the groove bottom wall (41'). This is partly illustrated in FIG. 3b.

Third, a procedure similar to the second technique above may be employed, with an anisotropic dry etch (to selectively remove nitride from the top surface and groove bottom wall) replacing the heavy ion implant step (3) and the first etch step (4), as indicated in FIG. 3c. After one of these three techniques is applied, the oxide layer 41' at the bottom wall 37 of the groove 35 should be 100-500 nm thick and the oxide layer 43' at the sidewalls 39 of the groove 35 should be 30-150 nm thick.

Figure 4:
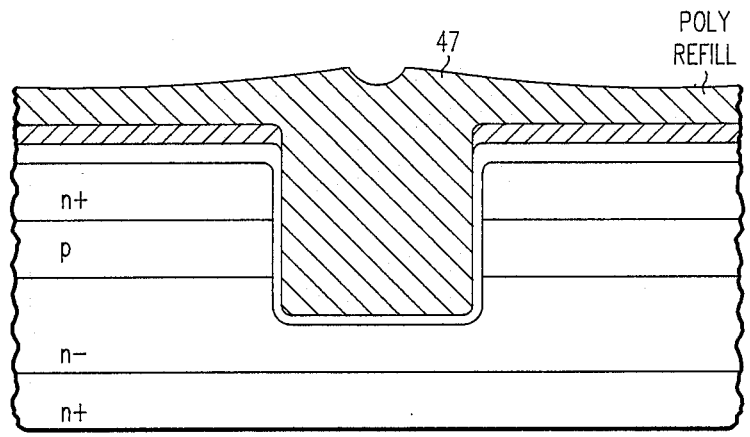
FIG. 4 is a sectional view of the structure of FIGS. 3 with bulk polysilicon grown in and on top of the groove and top surface of the structure.

Polysilicon 47, in a bulk filler layer, is now deposited in the groove and at the top of the groove, as illustrated in FIG. 4. The polysilicon is doped either in situ (preferably) or post-doping, with phosphorous or other suitable n type dopant.

Figure 5:
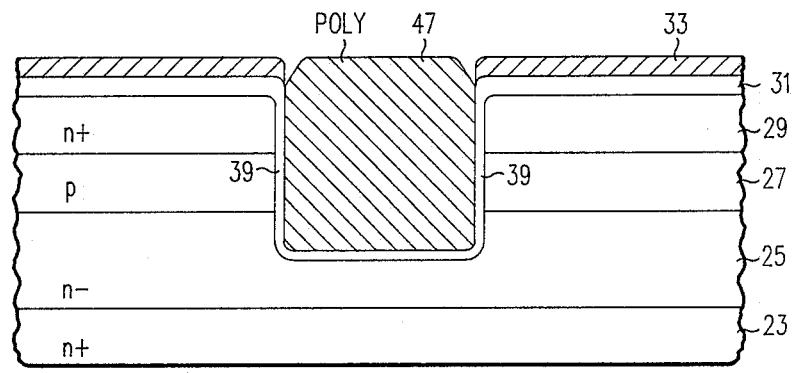
FIG. 5 is a sectional view of the structure of FIG. 4, after, substantially all of the polysilicon has been removed from the top surface of the structure.
Figure 6:
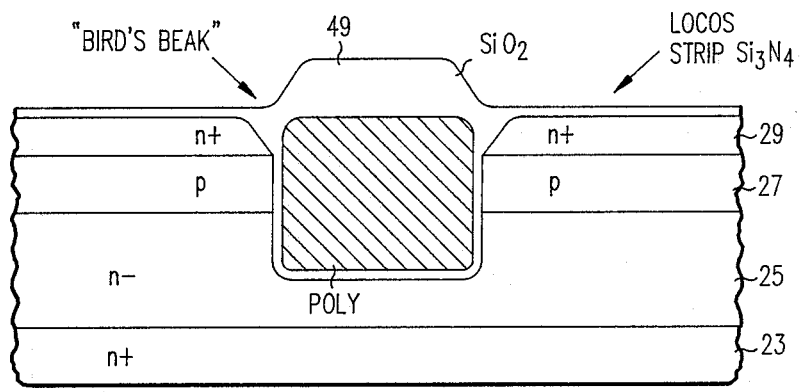
FIG. 6 is a sectional view of the structure of FIG. 5, with an electrically insulating layer of oxide introducted at the top of the groove.

A dry etchant is now applied at the top surface of the polysilicon to remove the polysilicon at the top surface and produce a planarization of the top surface of the structure, as indicated in FIG. 5. The remaining first nitride layer 33 and underlying thin oxide layer 31 are removed from the top surface. A local oxidization step is then employed to grow a thick layer 49 of oxide on top of the polysilicon 47 in the groove 35, with a small amount of this oxide extending beyond the side wall boundaries 39 of the groove 35 at the top surface, as indicated in FIG. 6, so that no polysilicon is exposed.

Figure 7:
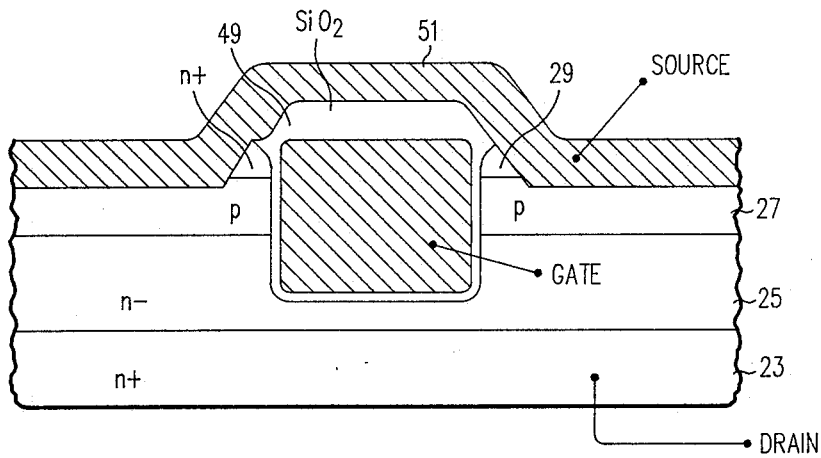
FIG. 7 is a sectional view of the structure of FIG. 6, with the nitride layer and adjacent oxide layer removed to expose the p layer adjacent to the groove, and with a layer of metallized material applied to the top surface of the structure.

Using "bird beaks" (shown in FIG. 6) for etch control around the top of the groove 35, the top surface of the structure, except the region overlying and immediately adjacent to the groove 35, is etched to remove most of the n+ layer 29 and expose the underlying p layer 27, as indicated in FIG. 7. A layer of metallization 51 is then applied to the entire top surface of the structure to produce a source contact for the device, as shown in FIG. 7.

Figure 8:
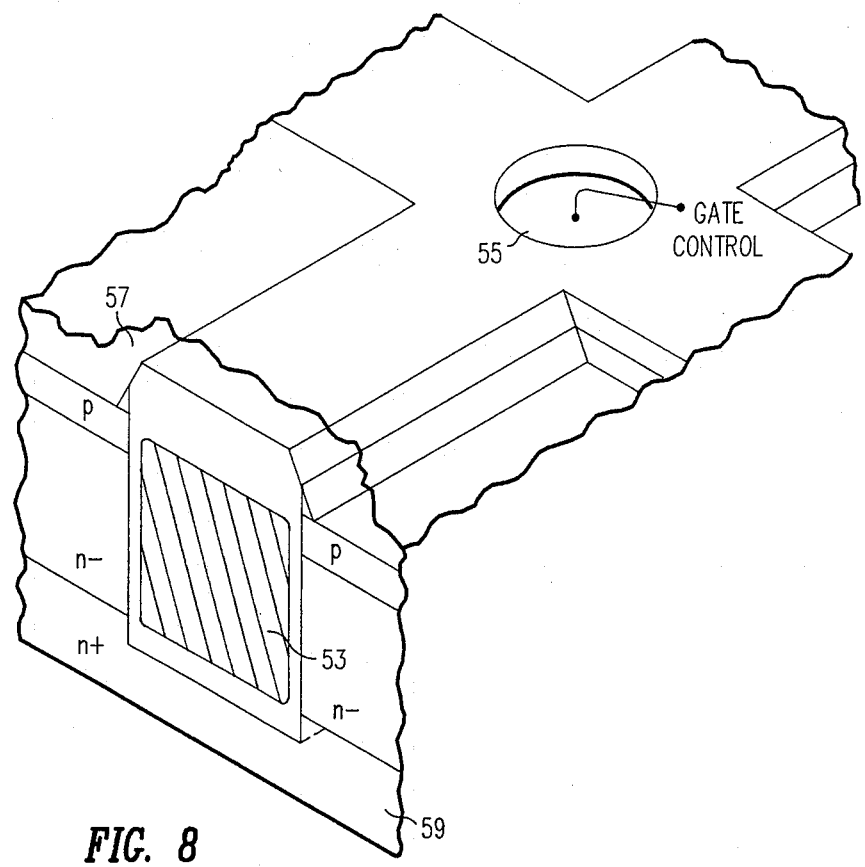
FIG. 8 is a sectional perspective view of a three-dimensional gate region that may be produced by the invention.

FIG. 8 is a sectional perspective view of a three-dimensional gate region that may be produced by the invention, showing the gate 53, gate contact 55, source 57 and drain 59. The presence of the large "bulk" of polysilicon 47 adjacent to the channel 61 will help insure that gate oxide breakdown does not occur for the high electrical fields needed to drive a power MOSFET.

Figure 9:
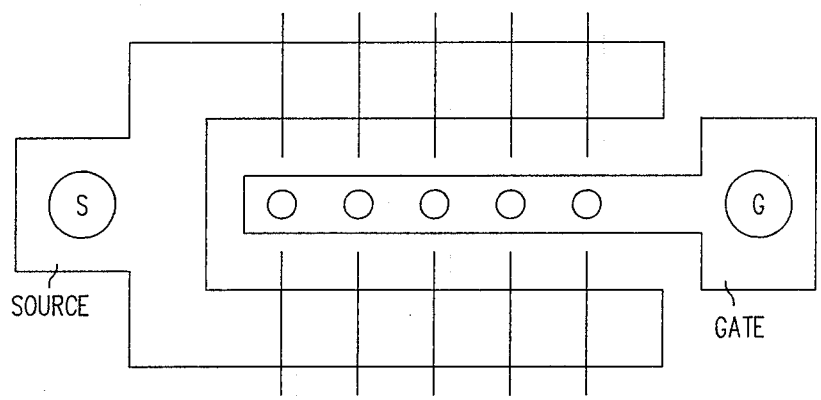
FIG. 9 is a plan view of a gate/source configuration that may be produced by the invention.
Figure 8:
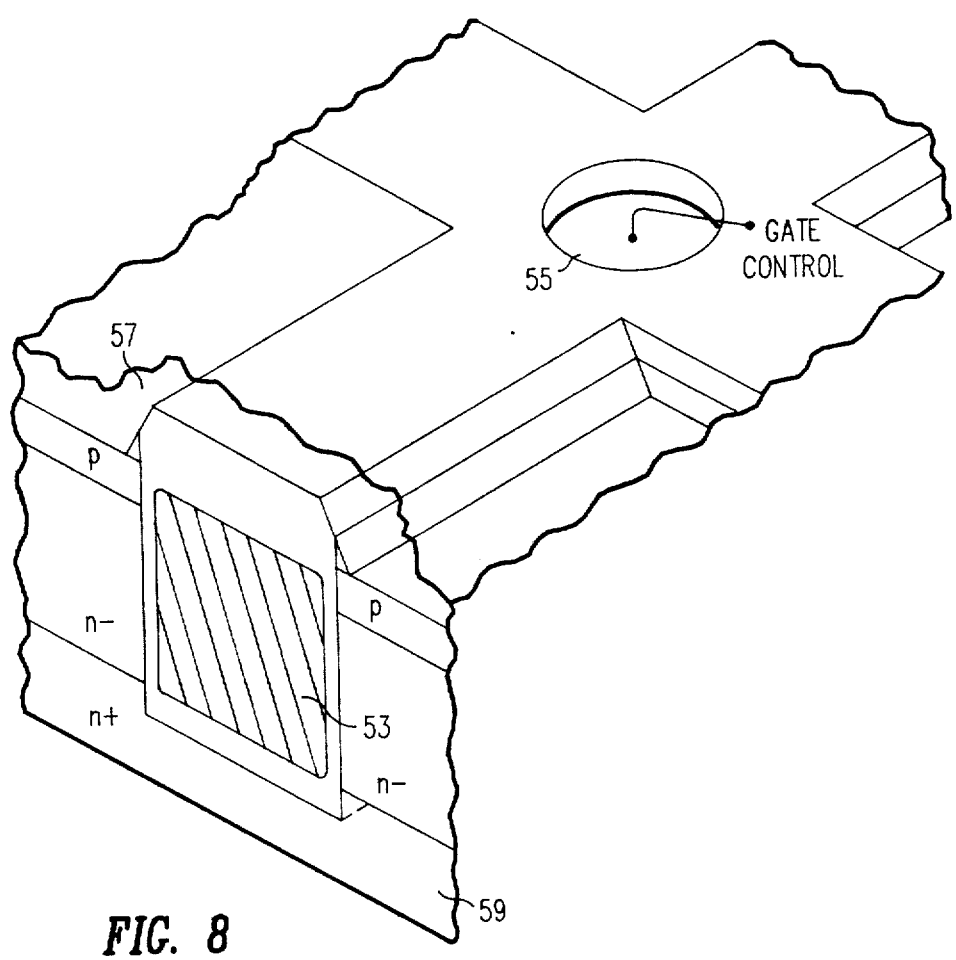
Figure 9:
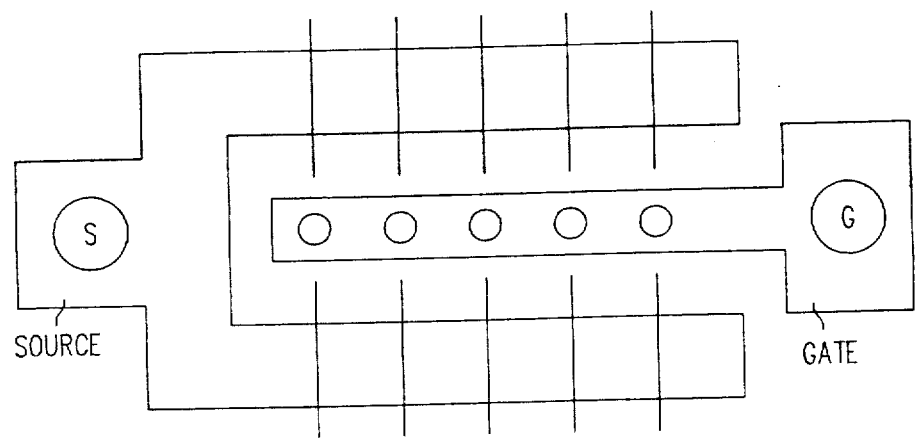

FIG. 9 shows, in plan view, a gate-source configuration that may be produced by the invention.

Although the preferred embodiments of the invention have been shown and described herein, variation and modification may be made without departing from the scope of the invention.

We claim:

1. A high cell density product for power MOSFETS, the product being produced by the following method:
   providing a heavily doped substrate, of first conductivity type, having a top surface;
   providing a first layer of lightly doped material of first conductivity type on top of and contiguous to the substrate;
   providing a second layer of second conductivity type opposite to the first conductivity type, on top of and contiguous to the first layer, with the first layer being positioned between the substrate and the second layer;
   providing a third layer of heavily doped material, of first conductivity type, on top of and contiguous to the second layer, with second layer being positioned between the first layer and the third layer:
   producing a substantially rectangular or trapezoidal groove in the combined first layer/second layer/third layer that reaches through all of a transverse section of the second layer, and reaches through a portion but not all of a transverse section of the first layer and exposes a bottom wall and said walls of the groove;
   providing a thick oxide layer inside the groove covering the bottom wall of the groove;
   providing a thin oxide layer inside the groove covering all side walls of the groove;
   providing polysilicon that fills the groove;
   providing a covering layer of substantially undoped oxide material that selectively covers the polysilicon at the top of the groove and immediately adjacent to the groove boundary at the top surface thereof so that no part of the polysilicon in the groove is exposed;
   removing substantially all of the third layer except a small region adjacent the thin oxide layer, so that a surface of the second layer is exposed; and
   providing a metallized layer of material covering and contiguous to the top surface of the second layer, the tip of the groove and all polysilicon material adjacent to the boundary of the groove.

2. A structure for providing power MOSFETs of high cell density, the structure comprising:
   a heavily doped substrate of semiconductor material of first conductivity type having a top surface:
   a first covering layer of lightly doped semiconductor material of first conductivity type, positioned on top of and contiguous to the substrate and having a top surface;
   a second covering layer of semiconductor material of second conductivity type opposite to the first conductivity type, positioned on top of and contiguous to the first covering layer and having a top surface;

a substantially rectangular or trapezoidal shaped groove that extends substantially vertically from the top surface of the second covering layer through all of a transverse section of the second covering layer and through a portion but not all of a transverse section of the first covering layer, the groove having a bottom wall and side walls;

a thick oxide layer positioned inside the groove and contiguous to the bottom wall of the groove;

an oxide layer positioned inside the groove and contiguous to and completely covering the side walls of the groove, where the thickness of this oxide layer is less than the thickness of the oxide layer that is contiguous to the bottom wall of the groove;

doped polysilicon having a top surface and positioned within and filling the remainder of the groove so that the top surface of the polysilicon extends above the top surface of the second covering layer;

a second thick oxide layer positioned on top of the polysilicon and extending beyond the sides thereof, so that, together with the oxide layer covering the side walls, the polysilicon is electrically isolated from the first and second covering layers;

a source region semiconductor material of heavily doped first conductivity type, positioned on top of a portion of the second covering layer adjacent to the side walls of the groove and adjacent to the second thick oxide layer; and a third covering layer of electrically conducting material covering and contiguous to the source region, the second thick oxide layer and the top surface of the second covering layer.

3. A structure according to claim 2, wherein said electrically conducting material of said third covering layer is a metal.

4. A structure according to claim 2, wherein said first thick oxide layer positioned at said bottom wall of said groove includes oxygen placed there by ion implantation.

* * * * *

UNITED STATES PATENT AND TRADEMARK OFFICE
CERTIFICATE OF CORRECTION

PATENT NO.   :   4,967,245
DATED        :   October 30, 1990
INVENTOR(S)  :   Adrian I. Cogan et al.

It is certified that error appears in the above-identified patent and that said Letters Patent is hereby corrected as shown below:

Col. 3, line 45, delete "in situ" and insert --in situ--.

The sheet of drawing 4 of 4, consisting of Figures 8-9 should be added as per attached sheet.

Signed and Sealed this

Twentieth Day of April, 1993

Attest:

MICHAEL K. KIRK

Attesting Officer

Acting Commissioner of Patents and Trademarks

(12) EX PARTE REEXAMINATION CERTIFICATE (6555th)
United States Patent
Cogan et al.

(10) Number: US 4,967,245 C1
(45) Certificate Issued: Dec. 9, 2008

(54) TRENCH POWER MOSFET DEVICE

(75) Inventors: Adrian I. Cogan, San Jose, CA (US); Neill R. Thornton, Alameda, CA (US)

(73) Assignee: Siliconix Incorporated, Los Angeles, CA (US)

Reexamination Request:
No. 90/007,088, Jun. 17, 2004

Reexamination Certificate for:
Patent No.: 4,967,245
Issued: Oct. 30, 1990
Appl. No.: 07/167,617
Filed: Mar. 14, 1988

Certificate of Correction issued Apr. 20, 1993.

(51) Int. Cl.
*H01L 29/78* (2006.01)
*H01L 29/06* (2006.01)
*H01L 21/3205* (2006.01)
*H01L 21/4763* (2006.01)

(52) U.S. Cl. .............. 257/331; 257/E29.133; 257/E21.339; 257/E29.027; 257/E29.136; 438/589

(58) Field of Classification Search .............. 257/330, 257/333

See application file for complete search history.

(56) References Cited

U.S. PATENT DOCUMENTS 4,859,621 A * 8/1989 Einthoven ............ 438/271
4,941,026 A * 7/1990 Temple ................ 257/333
5,164,325 A   11/1992 Cogan et al. ........... 437/29

OTHER PUBLICATIONS

Ueda et al. article entitled, "A new vertical sidewall channel power MOSFET with rectangular grooves" in Extended Abstracts of the 16th (1984 International) Conference on Solid State Devices and Materials, Kobe, 1984, pp. 313–316.*

Siliconix Incorporated's Opening Claim Construction Brief, filed Jul. 2, 2004 in U.S. District Court, Northern District of California, Case No. C03–4803 WHA, 35 pgs.

Defendants Alpha and Omega Semiconductor Incorporated and Alpha and Omega Semiconductor Limited's Opposition Claim Construction Brief, filed Jul. 14, 2004 in U.S. District Court, Northern Distrcit of California, Case No. C 03–4803 WHA, 37 pgs.

Siliconix Incorporated's Reply Claim Construction Brief, filed Jul. 21, 2004 in U.S. District Court, Northern District of California, Case No. C 03–4803 WHA, 19 pgs.

Claim Construction Order filed Sep. 10, 2004 in U.S. District Court, Northern District of California, Case No. C 03–4803 WHA, 15 pgs.

Plaintiff Siliconix Incorporated's Opening Claim Construction Brief, dated Mar. 31, 2006 in U.S. District Court, Northern District of California, Case No. C 05–01507 WHA, 30 pgs.

Defendant's Joint Claim Construction Brief, filed Apr. 14, 2006 in U.S. District Court, Northern District of California, Case No. C 05–01507 WHA, 28 pgs.

Plaintiff Siliconix Incorporated's Reply Claim Construction Brief, dated Apr. 21, 2006 in U.S. District Court, Northern District of California, Case No. C 05–01507 WHA, 15 pgs.

* cited by examiner

*Primary Examiner*—Erik Kielin

(57) ABSTRACT

A trench power MOSFET device is disclosed wherein the method of manufacturing produces a high density MOSFET cell with good breakdown characteristics.

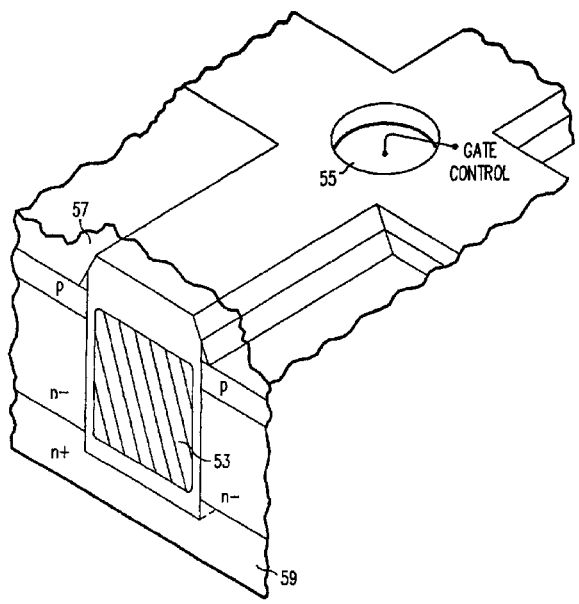

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 2 are determined to be patentable as amended.

Claims 3 and 4, dependent on an amended claim, are determined to be patentable.

1. A high cell density product for power MOSFETS, the product being produced by the following method:
   providing a heavily doped substrate, of first conductivity type, having a top surface;
   providing a first layer of lightly doped material of first conductivity type on top of and contiguous to the substrate;
   providing a second layer of second conductivity type opposite to the first conductivity type, on top of and contiguous to the first layer, with the first layer being positioned between the substrate and the second layer;
   providing a third layer of heavily doped material, of first conductivity type, on top of and contiguous to the second layer, with *the* second layer being positioned between the first layer and the third layer, *the uppermost part of the top surface of the third layer disposed higher than the uppermost part of the top surface of the second layer*;
   producing a substantially rectangular or trapezoidal groove in the combined first layer/second layer/third layer that reaches through all of a transverse section of the second layer, and reaches through a portion but not all of a transverse section of the first layer and exposes a bottom wall and said walls of the groove;
   providing a thick oxide layer inside the groove covering the bottom wall of the groove;
   providing a thin oxide layer inside the groove covering all side walls of the groove;
   providing polysilicon that fills the groove;
   providing a covering layer of substantially undoped oxide material that selectively covers the polysilicon at the top of the groove and immediately adjacent to the groove boundary at the top surface thereof so that no part of the polysilicon in the groove is exposed;
   removing substantially all of the third layer except a small region adjacent the thin oxide layer, so that a surface of the second layer is exposed; and
   providing a metallized layer of material covering and contiguous to the top surface of the second layer, the tip of the groove and all polysilicon material adjacent to the boundary of the groove.

2. A structure for providing power MOSFETs of high cell density, the structure comprising:
   a heavily doped substrate of semiconductor material of first conductivity type having a top surface:
   a first covering layer of lightly doped semiconductor material of first conductivity type, positioned on top of and contiguous to the substrate and having a top surface;
   a second covering layer of semiconductor material of second conductivity type opposite to the first conductivity type, positioned on top of and contiguous to the first covering layer and having a top surface;
   a substantially rectangular or trapezoidal shaped groove that extends substantially vertically from the top surface of the second covering layer through all of a transverse section of the second covering layer and through a portion but not all of a transverse section of the first covering layer, the groove having a bottom wall and side walls;
   a thick oxide layer positioned inside the groove and contiguous to the bottom wall of the groove;
   an oxide layer positioned inside the groove and contiguous to and completely covering the side walls of the groove, where the thickness of this oxide layer is less than the thickness of the oxide layer that is contiguous to the bottom wall of the groove;
   doped polysilicon having a top surface and positioned within and filling the remainder of the groove so that the *uppermost part of the* top surface of the polysilicon extends above *the uppermost part of* the top surface of the second covering layer;
   a second thick oxide layer positioned on top of the polysilicon and extending beyond the sides thereof, so that, together with the oxide layer covering the side walls, the polysilicon is electrically isolated from the first and second covering layers;
   a source region semiconductor material of heavily doped first conductivity type, positioned on top of a portion of the second covering layer adjacent to the side walls of the groove and adjacent to the second thick oxide layer; and
   a third covering layer of electrically conducting material covering and contiguous to the source region, the second thick oxide layer and the top surface of the second covering layer.

\* \* \* \* \*